(12) United States Patent
Pinto et al.

(10) Patent No.: US 11,653,463 B2
(45) Date of Patent: May 16, 2023

(54) REMOVABLE MEMORY CARD WITH EFFICIENT CARD LOCK MECHANISM AND PADS LAYOUT

(71) Applicant: Western Digital Technologies, Inc., San Jose, CA (US)

(72) Inventors: Yoseph Pinto, Tel Aviv (IL); Michael Lavrentiev, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/899,972

(22) Filed: Jun. 12, 2020

(65) Prior Publication Data

US 2021/0368636 A1 Nov. 25, 2021

Related U.S. Application Data

(60) Provisional application No. 63/027,730, filed on May 20, 2020.

(51) Int. Cl.
*H05K 5/02* (2006.01)

(52) U.S. Cl.
CPC .......... *H05K 5/026* (2013.01); *H05K 5/0208* (2013.01); *H05K 5/0247* (2013.01)

(58) Field of Classification Search
CPC ....................................................... H05K 1/02
See application file for complete search history.

(56) References Cited

U.S. PATENT DOCUMENTS

| D523,435 | S | 6/2006 | Takiar et al. |
|---|---|---|---|
| 7,306,161 | B2 | 12/2007 | Takiar et al. |
| 7,336,498 | B2 | 2/2008 | Takiar et al. |
| 7,416,132 | B2 | 8/2008 | Takiar et al. |
| 2004/0084538 | A1 | 5/2004 | Nishizawa et al. |
| 2005/0011671 | A1 | 1/2005 | Takiar et al. |
| 2006/0053241 | A1 | 3/2006 | Lin et al. |
| 2008/0016082 | A1 | 1/2008 | Hsu et al. |
| 2009/0283885 | A1* | 11/2009 | Wada ............... G06K 19/07737 257/679 |
| 2014/0117097 | A1* | 5/2014 | Bosquet ........... G06K 19/07743 235/492 |
| 2017/0154003 | A1 | 6/2017 | Han et al. |
| 2019/0182954 | A1 | 6/2019 | Sirajudeen et al. |
| 2020/0090020 | A1* | 3/2020 | Fujimoto ......... G06K 19/07732 |
| 2020/0413531 | A1* | 12/2020 | Wallash ............... H05K 3/4007 |

OTHER PUBLICATIONS

SD Association; "Sd Express Delivers New Gigabyte Speeds for Sd Memory Cards"; retrieved from the Internet at https://www.sdcard.org/pdf/SDExpressDeliversNewGigabtyeSpeedsForSDMemorvCards.pdf on Mar. 24, 2021; May 19, 2020; 3 pages.

(Continued)

*Primary Examiner* — Jerry Wu
(74) *Attorney, Agent, or Firm* — Crowell & Moring LLP

(57) ABSTRACT

A memory card is provided with various pad layouts to prevent a data signal pad from contacting a power contact in a host during insertion and removal of the memory card. The memory card can have a form factor and features that accommodate a relatively-large memory with relatively-high performance and accompanying thermal conditions. An efficient card lock mechanism is also provided.

7 Claims, 16 Drawing Sheets

(56) References Cited

OTHER PUBLICATIONS

Liu, Zhiye; "Toshiba Unveils XFMEXPRESS Form Factor for NVMe SSDs"; Sep. 6, 2019; Aug. 6, 2019; retrieved from the Internet at https://www.tomshardware.com/news/toshiba-sfmexpress-nvme-ssd.40104.html on Mar. 24, 2021; 11 pages.
International Search Report completed Mar. 24, 2021 for International Application No. PCT/US2021/016882.
Written Opinion completed Mar. 24, 2021 for International Application No. PCT/US2021/016882.
Israel Patent Office Search Strategy completed Mar. 24, 2021 for International Application No. PCT/US2021/016882.
U.S. Appl. No. 16/700,501, filed Dec. 2, 2019 entitled "Removable Memory Card with Efficient Card Lock Mechanism and Pads Layout."

* cited by examiner

* Any Signal or Ground Pads
** High-Speed Differential Interfaces of the I/O And/Or Other Signal Interfaces And/Or Ground Pads

* Any Signal, Power, or Ground Pads
** High-Speed Differential Interfaces of the I/O And/Or Other Signal Interfaces And/Or Ground Pads \* Any Signal, Power, or Ground Pads \*\* High-Speed Differential Interfaces of the I/O And/Or Other Signal Interfaces And/Or Ground Pads \* Any Signal or Ground Pads \*\* High-Speed Differential Interfaces of the I/O And/Or Other Signal Interfaces And/Or Ground Pads

REMOVABLE MEMORY CARD WITH EFFICIENT CARD LOCK MECHANISM AND PADS LAYOUT

CROSS-REFERENCE TO RELATED APPLICATION

This application claims the benefit of U.S. patent application No. 63/027,730, filed May 20, 2020, which is hereby incorporated by reference.

BACKGROUND

A host can use a memory card to read and write data. A host can be, for example, a mobile computing device, such as a phone, tablet, or laptop. A memory card can be, for example, a microSD™ card. Other types of hosts and memory cards can be used.

DETAILED DESCRIPTION

By way of overview, there is a need in mobile computing devices (e.g., phones, tablets, laptops, gaming, Internet of Things (IoT)) for a removable memory card that is easy to replace and upgrade or expand, has a low profile, has a relatively-large memory, and has relatively-high performance. Existing memory cards, such as microSD™ memory cards, have a form factor that is too small to handle the high performance demands and the thermal conditions that result from such high performance. The following embodiments provide memory cards with different form factors that can address the above issues.

Figure 1:
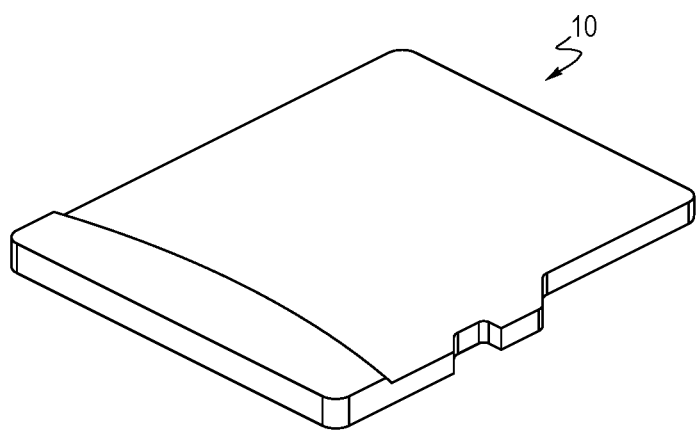
FIG. 1 is a rear, top perspective view of a memory card of an embodiment.
Figure 2:
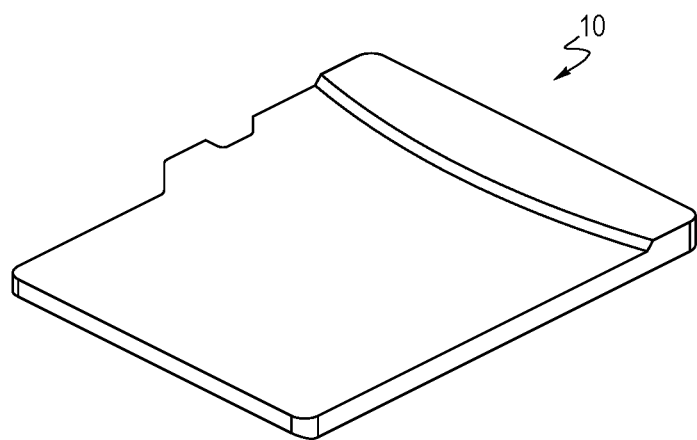
FIG. 2 is a front, top perspective view of the memory card shown in FIG. 1.
Figure 6:
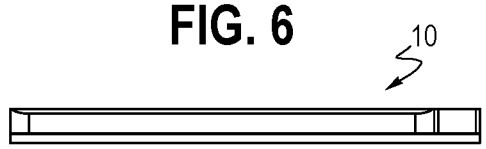
FIG. 6 is a front view of the memory card shown in FIG. 1.
Figure 4:
FIG. 4 is a left-side view of the memory card shown in FIG. 1.
Figure 3:
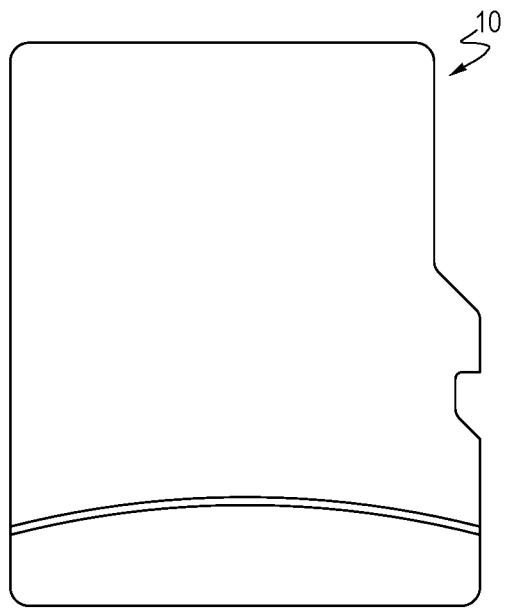
FIG. 3 is a top view of the memory card shown in FIG. 1.
Figure 5:
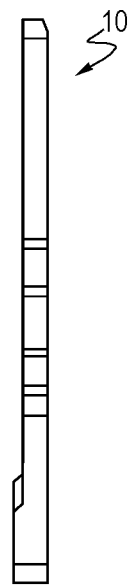
FIG. 5 is a right-side view of the memory card shown in FIG. 1.
Figure 7:
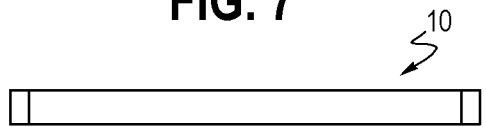
FIG. 7 is a rear view of the memory card shown in FIG. 1.
Figure 8:
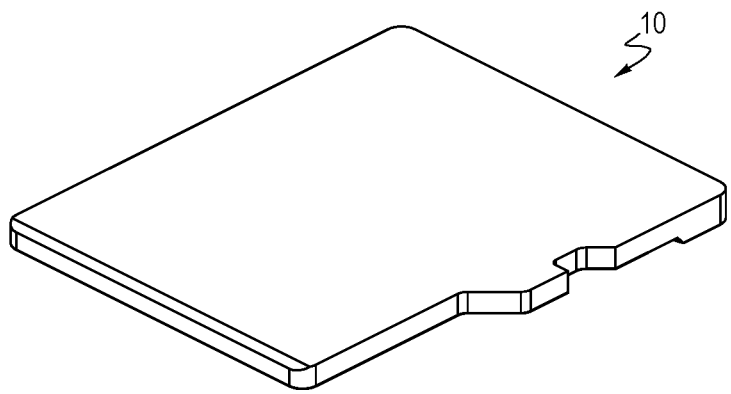
FIG. 8 is a front, bottom perspective view of the memory card shown in FIG. 1.
Figure 9:
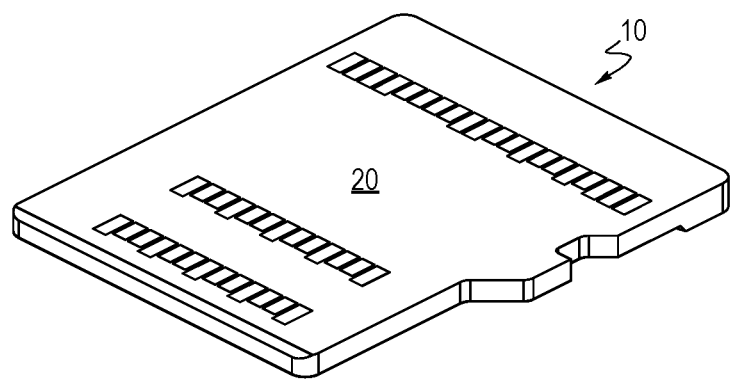
FIG. 9 shows the front, bottom perspective view of the memory card shown in FIG. 8 with a first pad layout.
Figure 10:
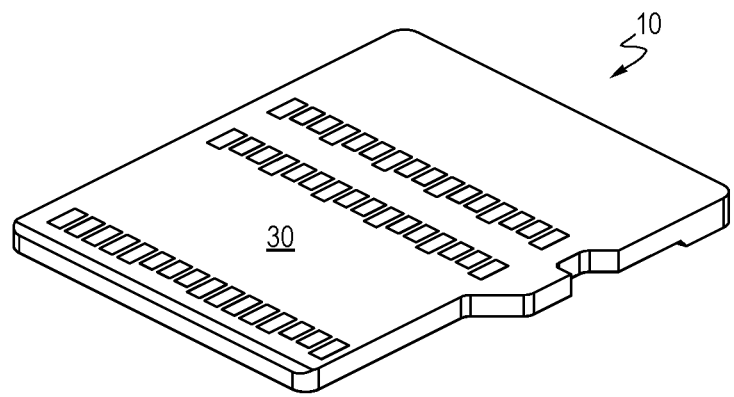
FIG. 10 shows the front, bottom perspective view of the memory card shown in FIG. 8 with a second pad layout.
Figure 11:
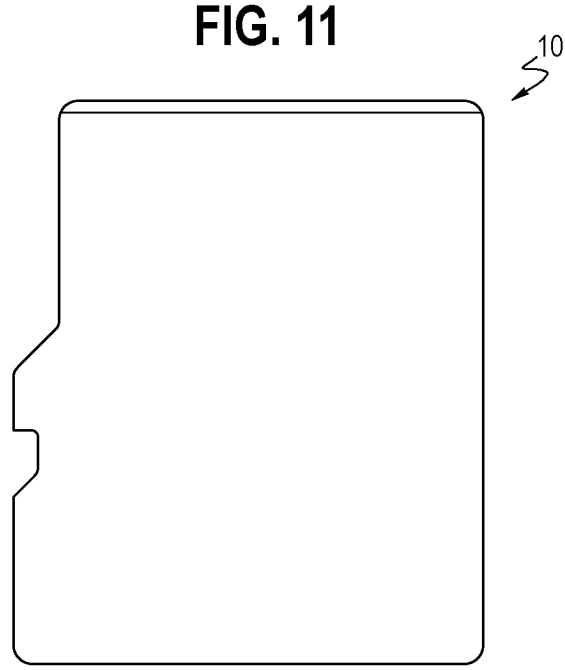
FIG. 11 is a bottom view of the memory card shown in FIG. 1.
Figure 12:
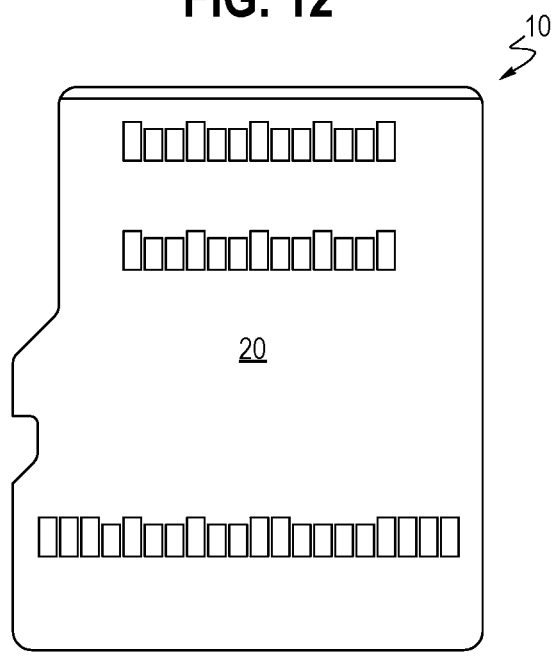
FIG. 12 shows the bottom view of the memory card shown in FIG. 11 with the first pad layout.
Figure 13:
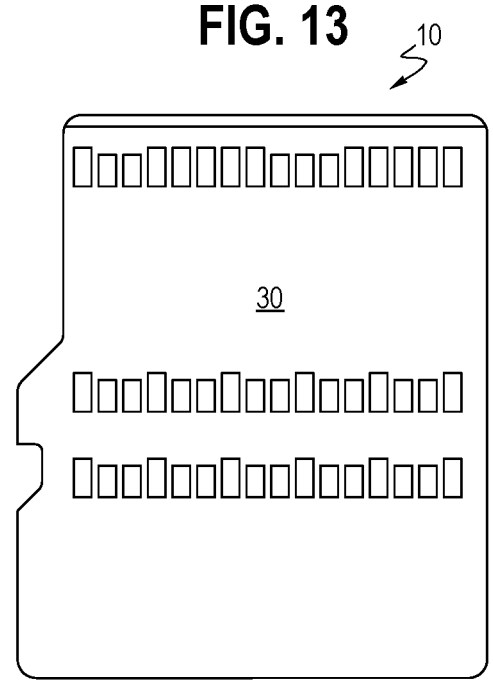
FIG. 13 shows the bottom view of the memory card shown in FIG. 11 with the second pad layout.
Figure 14:
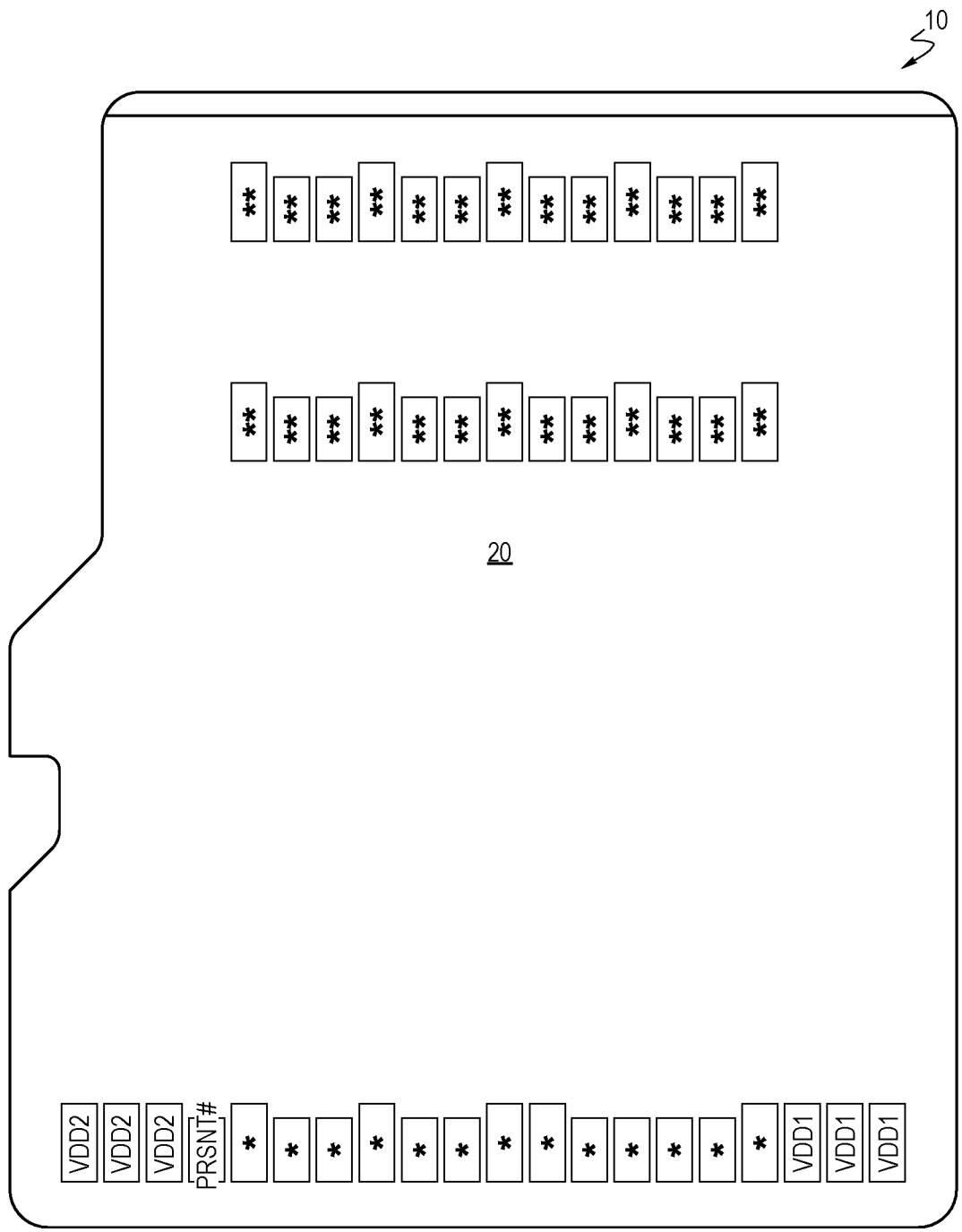
FIG. 14 shows the bottom view of the memory card shown in FIG. 12 with a more-detailed view of the first pad layout.
Figure 15:
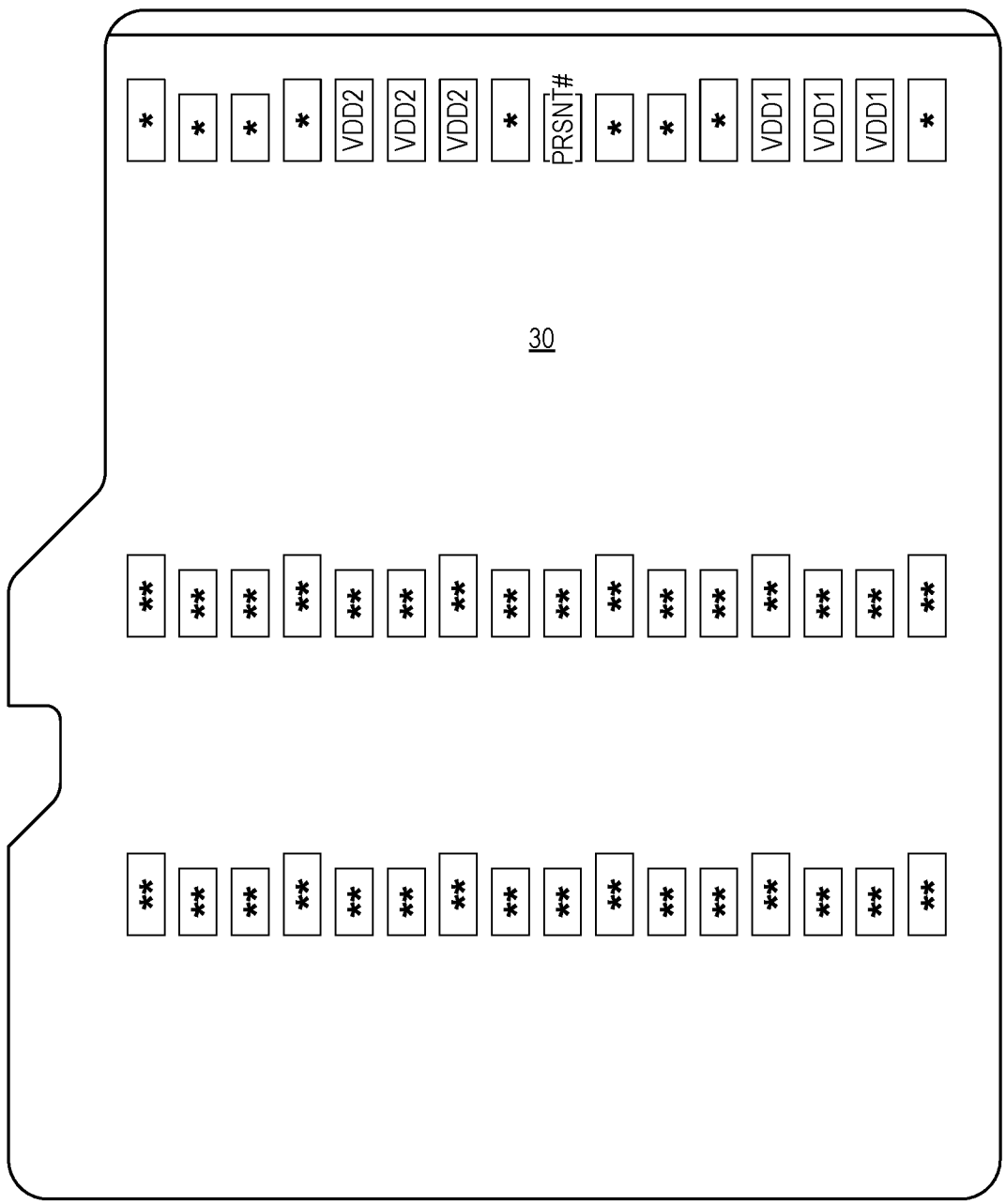
FIG. 15 shows the bottom view of the memory card shown in FIG. 13 with a more-detailed view of the second pad layout.
Figure 16:
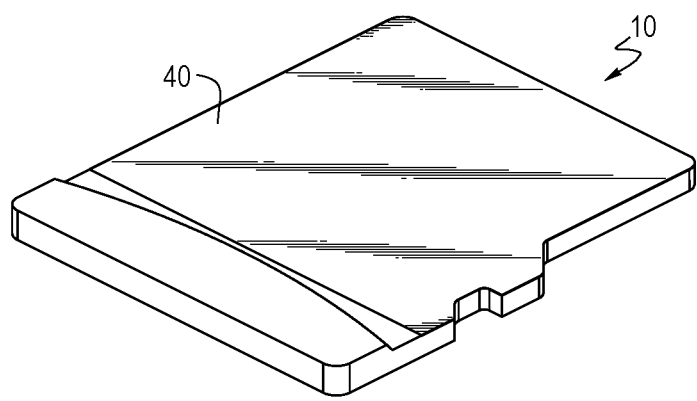
FIG. 16 is a rear, top perspective view of a memory card of another embodiment, in which the memory card has a metal plate.
Figure 17:
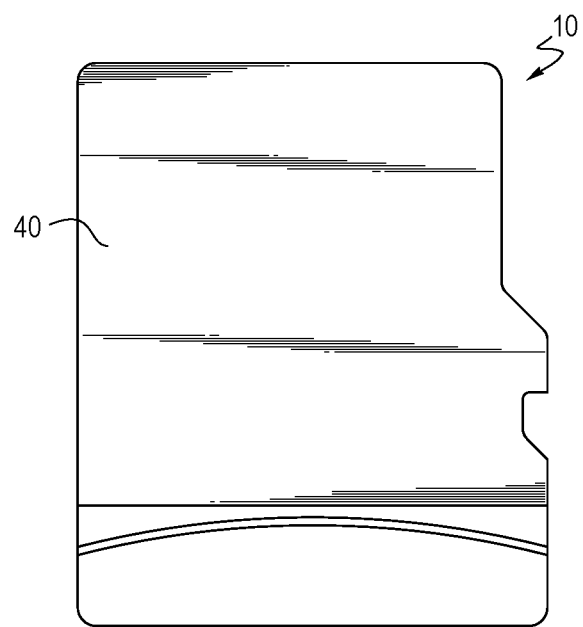
FIG. 17 is a top view of the memory card shown in FIG. 16.
Figure 18:
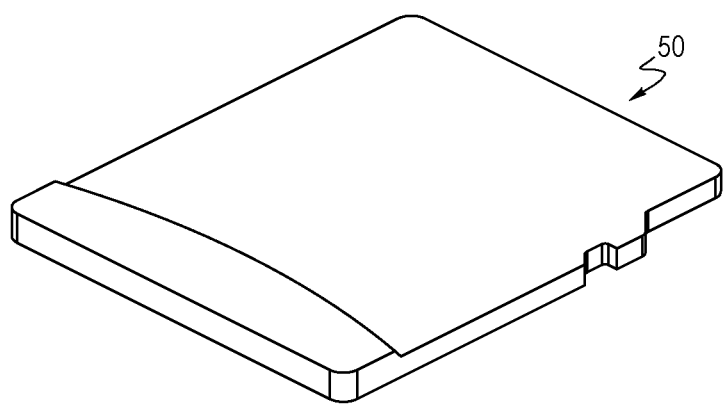
FIG. 18 is a rear, top perspective view of a memory card of another embodiment with different card locking support proportional size and placement.
Figure 19:
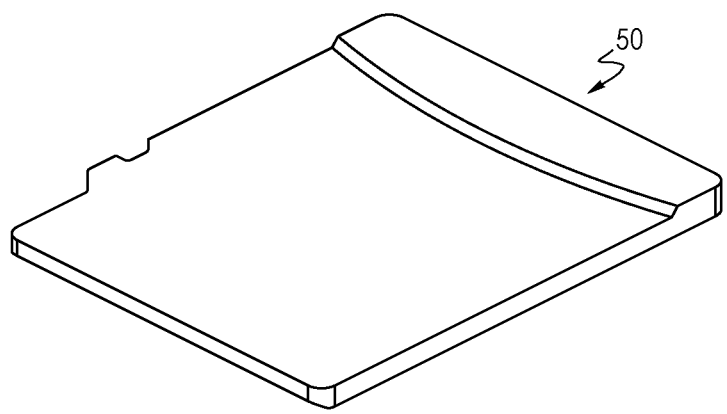
FIG. 19 is a front, top perspective view of the memory card shown in FIG. 18.
Figure 23:
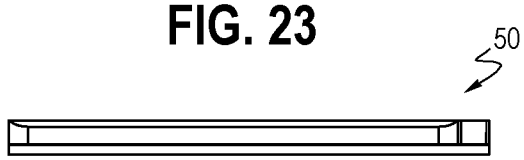
FIG. 23 is a front view of the memory card shown in FIG. 18.
Figure 21:
FIG. 21 is a left-side view of the memory card shown in FIG. 18.
Figure 20:
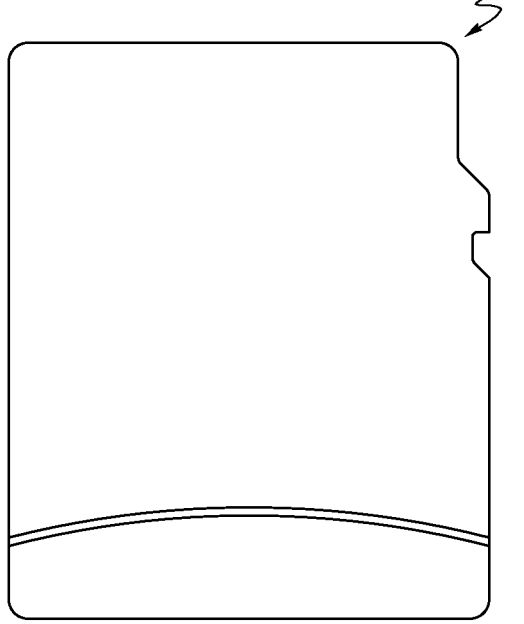
FIG. 20 is a top view of the memory card shown in FIG. 18.
Figure 22:
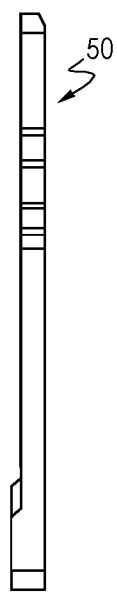
FIG. 22 is a right-side view of the memory card shown in FIG. 18.
Figure 24:
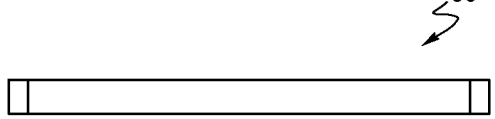
FIG. 24 is a rear view of the memory card shown in FIG. 18.
Figure 25:
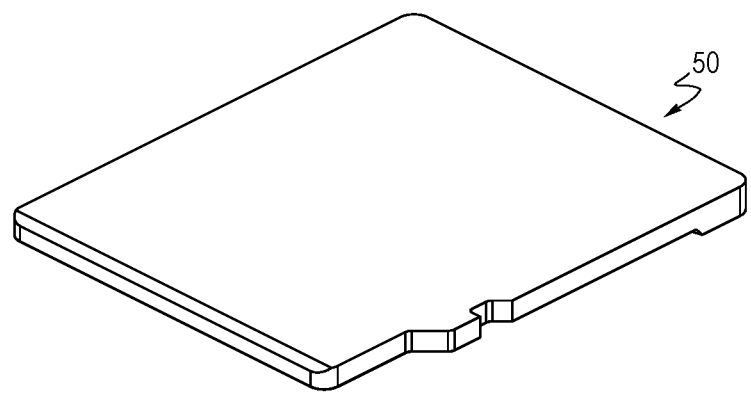
FIG. 25 is a front, bottom perspective view of the memory card shown in FIG. 18.

In one embodiment, a memory card is provided that has an overall shape similar to a microSD™ card but with larger dimensions and different pad layouts to support the memory, performance, and thermals capabilities noted above. FIGS. 1-8 and 11 show various views of one such memory card 10 of an embodiment to illustrate its form factor. Various pad layouts can be used on the bottom of the memory card. FIGS. 9, 12, and 14 illustrate one example pad layout, and FIGS. 10, 13, and 15 illustrate another example pad layout. To assist with heat dissipation as well as potential EMI protection, a metal plate 40 can be used on the top of the memory card 10, and FIGS. 16 and 17 illustrate one example of this.

The pads can be used to connect with corresponding electrical connectors in a host to place the host in communication with the memory card 10. The memory card 10 can comprise any suitable memory (including a three-dimensional memory), and a controller that can be configured to read data from and store data in the memory. The controller can implement other functions, such as error correction and storage algorithms.

There are several basic assumptions for the two pad layouts of these embodiments:

- Support four peripheral component interconnect express (PCIe) lanes with up to two power supplies (e.g., 3.3v/1.8v or 2.7v/1.2v)
- Separate the PCIe high speed I/Os from the rest and group them per PCIe lane
- Provide GND isolations where needed
- Allow balancing of the differential interfaces with PWR/GND
- Have a separate pads row for the power, clock, and sideband signals
- Avoid any conflicts of signal pads touching power pads during hot insertion/removal
- Spread of the three rows allows better heat dissipation from the card to the printed circuit board and easier connector design allowing dense pads with enough strength.
- Includes PRSNT # (Present Detect) functional pad for card insertion/removal detection (without need for a card-detect switch)
- Include two pads for CardType, which allow the hardware host to detect card type after card insertion is detected. This may provide advance information about the card's type if needed
- Include a few reserved pads for the future In both of the pad layouts 20, 30 mentioned above, there are three rows of pads. One row includes power supplies, clocks, and side band signals, and other rows include as many differential high-speed interfaces as needed. These pads support a high-speed differential interface based on the PCIe interface standard. The pads are powered with at least one power supply along with a few side band signals. The pads are arranged in a way that signal pads will never touch any power pads of the host side during card insertion or removal, thereby avoiding any conflicts in case of hot plug-in/out (i.e., insertion or removal of the card while the host is providing power to the card). A few pads are allocated for Card Type indication, allowing the host to detect through its hardware the type of an inserted card and/or its characteristics. A Present Detect pad is used to detect card insertion/removal, eliminating the need for a card detect switch commonly used in microSD™ cards. In this embodiment, the pads are arranged in a way that the Present Detect contact of the connector side will never touch any other signal pads, power, or ground during card insertion or removal, thereby avoiding any false card detection.

As mentioned above, the multiple-row pad layouts 20, 30 of these embodiments address the possible conflicts of signal shorts during hot plug-in/out. Due to the small cards dimension and the need to support multiple PCIe lanes, a large number of pads may be required to be placed in a relative-small area. Therefore, three rows of pads may be required to be placed one after the other. Hot plug-in/out can be supported as consumers may remove a card without any notification. That is, power might be supplied to the power contacts of the connector during card insertion or removal, and it is desired that no harm will be caused either to the card or to host if any signal or ground pad might touch any of the power contacts during the card's insertion/removal path. The same potential problem might happen if the host's present-detect contact touches any signal, power, or ground during the path of card insertion/removal. Such unintentional touch might cause a false card detect to the host, which is something that is desired to be avoided. Also, the host may like to get information about the card's type or specific characteristics or configuration using its hardware circuitry and without the need to initialize the card and read its internal information. Such need may be required for hardware-related support needs that are expected to be provided before any card operation is happening (i.e., supply of specific power voltage level or allowance of specific max current consumption during initialization time, etc.). A method to allow such information to be provided to the host and without being false detected due to hot plugin/out path conflicts can be provided.

As between the first and second pad layouts of these embodiments, in the first pad layout 20, the power rails are at the back of the card 10, closer to the thicker area of the card 10 (that may include the internal power circuits). This requires an open path between front pad rows eliminating contacting the front rows pads with power contacts during hot card insertion or removal. In the second pad layout 30, the power/control line is at the front, so connector's contacts of other rows never touch it. This allows a greater distance between the pads, which provides more flexibility.

In one embodiment, the following pad dimensions are used. Of course, this is just one example, and other dimensions can be used.

Pad width of about 0.75 mm and a distance between the centers of pads of about 1.05 mm (the distance between pads is about 0.3 mm).

The length of the short pad is about 1.35 mm, and the length of the long pad is about 1.65 mm.

The distance between differential high speed signal rows can be about 2 mm.

As mentioned above, the advantage of these simplified pad layouts 20, 30 is that they avoid any potential electrical conflicts or false card detection indication that might be caused by touch of any card pads with power contacts on the connector side or present detect (PRSNT #) contact during hot insertion/removal.

Prior cards do not address the above issues adequately. For example, edge card connectors (such as the ones used on mother boards) have a very large profile and are less preferable in small, thin equipment like mobile devices. Also, hinge-type connectors (such as old "under battery" SIM cards or XFMexpress cards) do not have the problem of card pads sliding under other connector contacts during card insertion/removal. However, such connectors have a quite-high profile due to their mechanical strength and are not well suited for external removable card usages. Other solutions allows such contacts to happen (as in SD UHSII cards and SD Express cards) with special care considerations required to assure that no harm will happen. Such considerations limit the continuous evolution of the card's functionality and might put the card under risk if card/host manufacturers do not meet the restricted protection rules.

Also, the card type pads allow a hardware indication to the host about various card types/configurations right after card insertion detection. Further, today such information is provided usually through physical cuts on the board (i.e., in M.2 cards). Such solution requires different printed circuit boards for each card type as well as a configurable connector. It also does not allow electrical indication of specific configuration (programmed through software on the card or in the field). Other solutions provide the information at the same time as card insertion. In such cases, those card type pads need to also be protected against conflicts during card insertion/removal and require a dedicated path. While in the given solution, the card type pads are expected to be read by the host only after card detection was indicated to the host. Such solution allows no need to protect the path of those pads/contacts during card insertion/removal and allows the card, after it is inserted, to provide a logical value that corresponds to card's type/configuration.

In summary, the memory cards 10 of these embodiments address several issues and provide several advantages. For example, the pad layout 20, 30 of these embodiments avoid any potential electrical conflicts or false card detection indication that might be caused by touch of any pads touching power contacts on the connector side or card present detect (PRSNT #) contact during hot insertion/removal. That is achieved either by placing all the power pads and present-detect pad in the front row or keeping a clear path for those specific pads if they are placed in the second or third rows. Also, card-type pads allow a hardware indication to the host about various card types/configurations right after card insertion is detected. A few card pads are dedicated for that, and they are active only after the card 10 was inserted as well as sensed by the host only after card insertion was detected.

Figure 26:
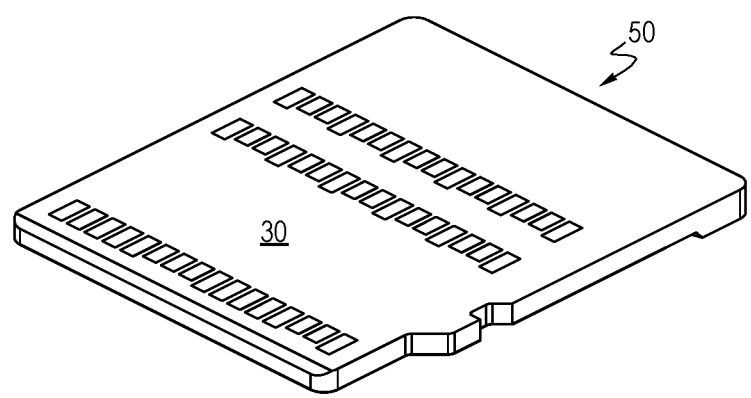
FIG. 26 shows the front, bottom perspective view of the memory card shown in FIG. 25 with a first pad layout.
Figure 27:
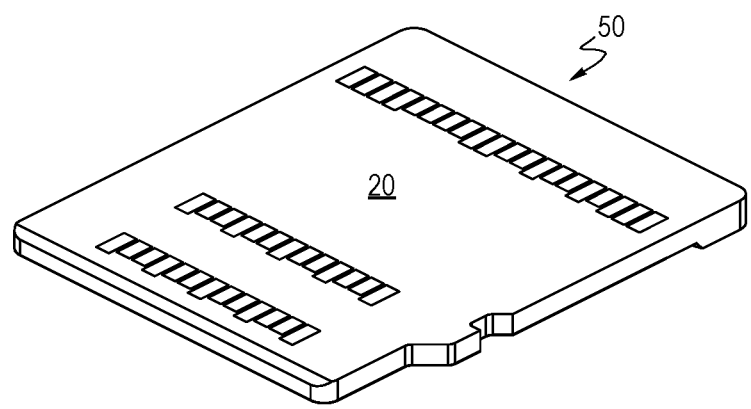
FIG. 27 shows the front, bottom perspective view of the memory card shown in FIG. 25 with a second pad layout.
Figure 28:
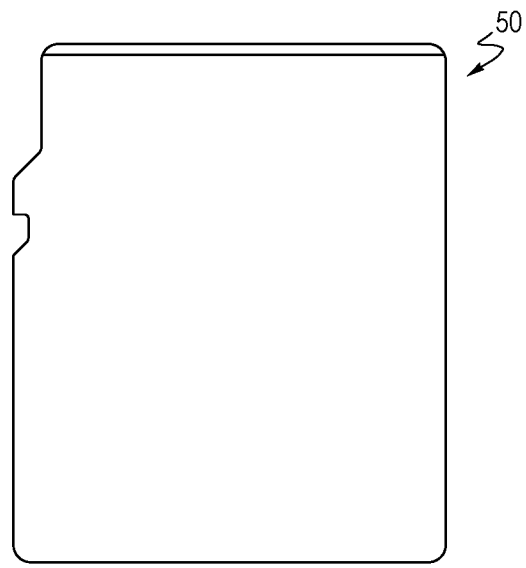
FIG. 28 is a bottom view of the memory card shown in FIG. 18.
Figure 29:
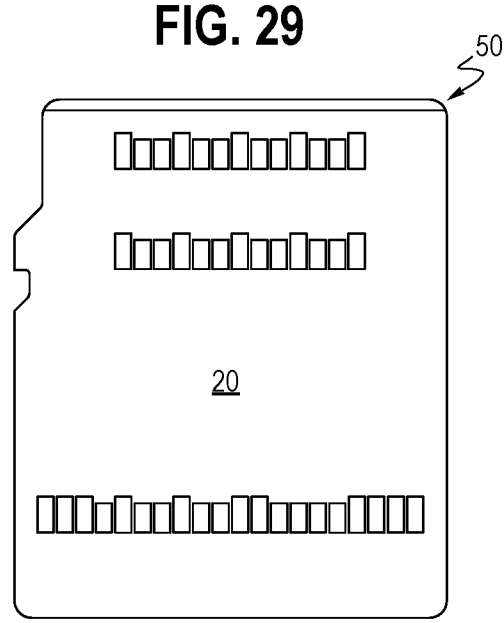
FIG. 29 shows the bottom view of the memory card shown in FIG. 27 with the second pad layout.
Figure 30:
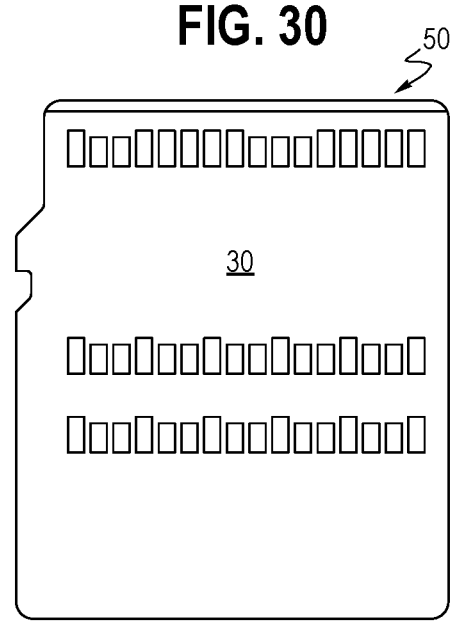
FIG. 30 shows the bottom view of the memory card shown in FIG. 26 with the first pad layout.
Figure 31:
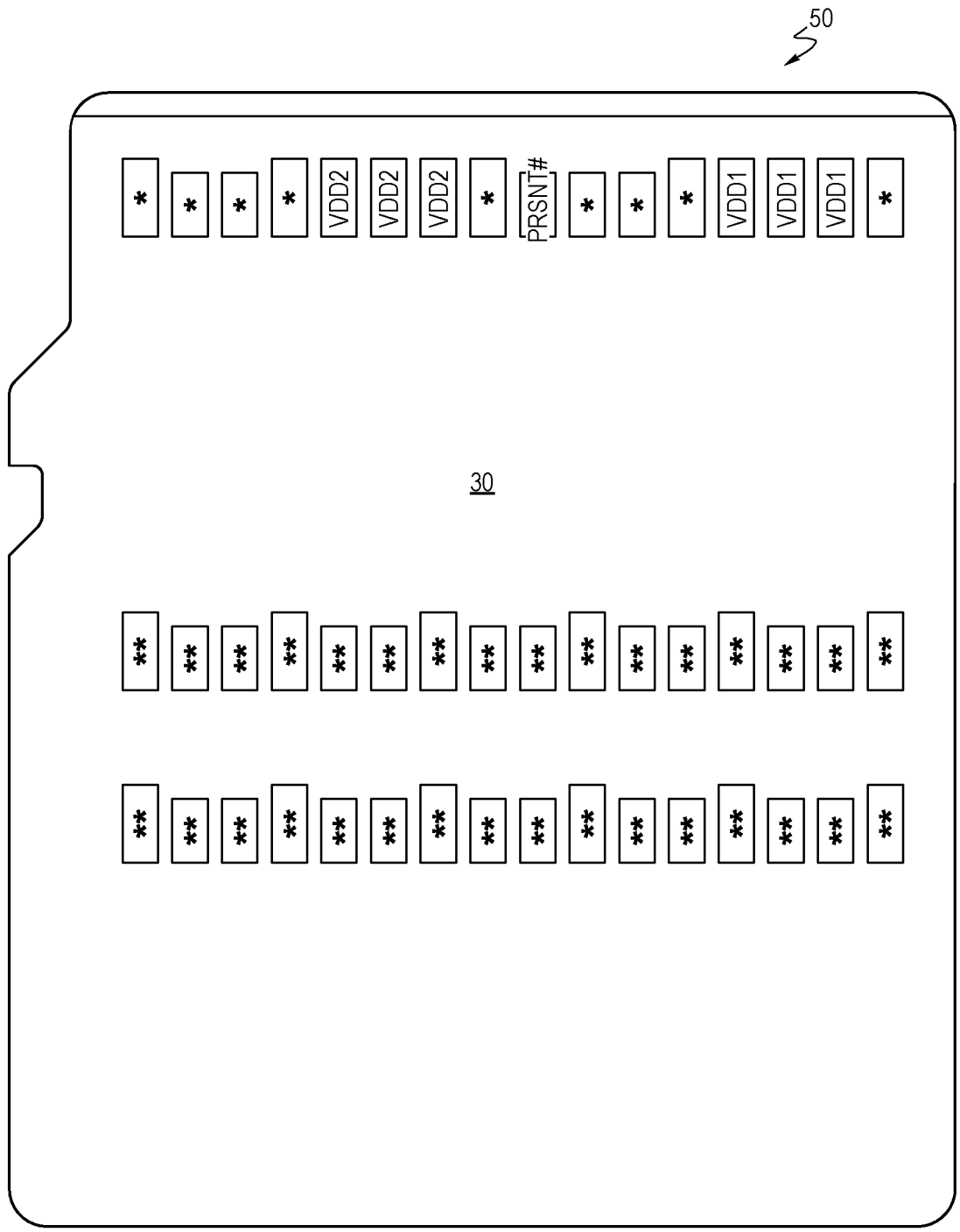
FIG. 31 shows the bottom view of the memory card shown in FIG. 30 with a more-detailed view of the first pad layout.
Figure 32:
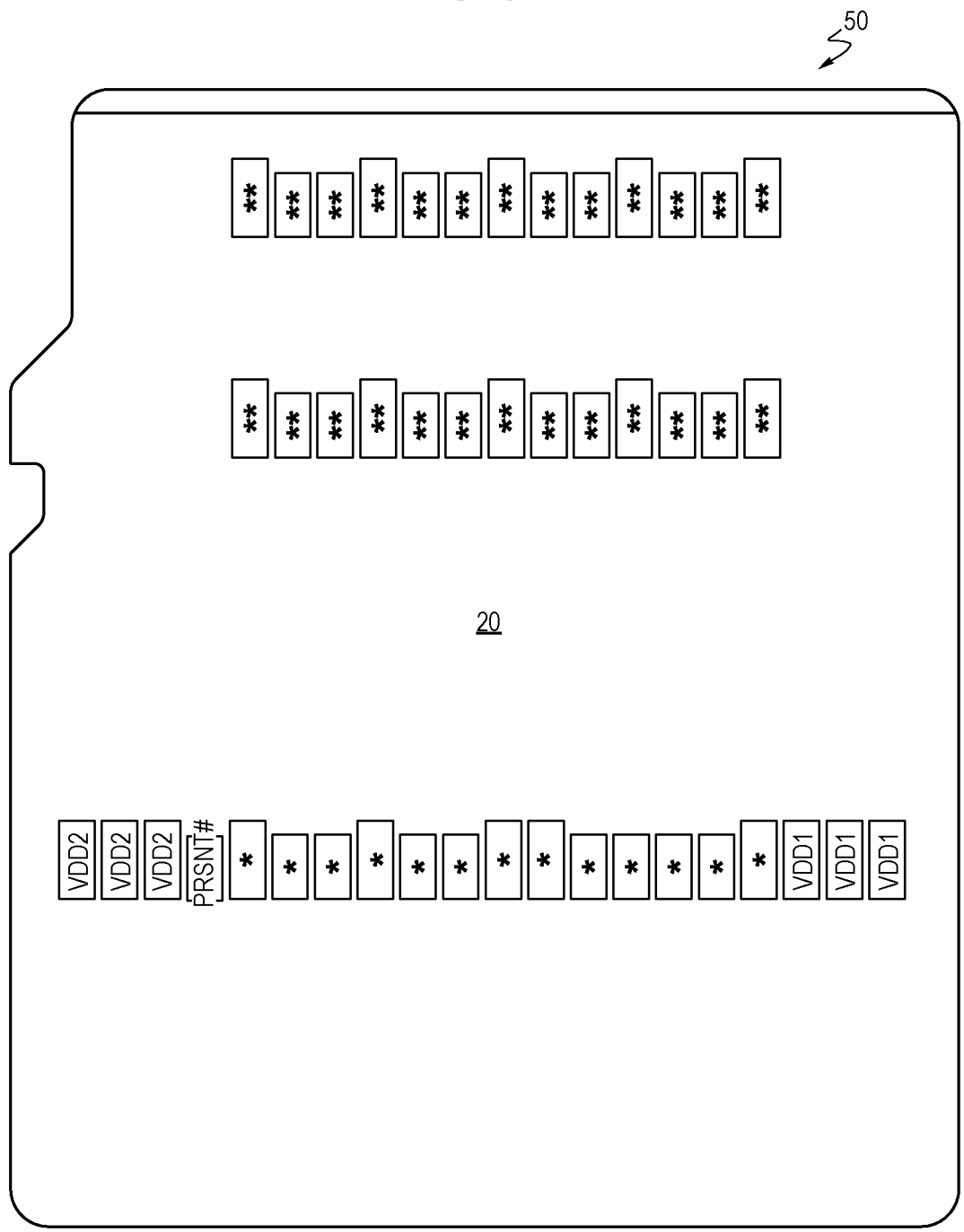
FIG. 32 shows the bottom view of the memory card shown in FIG. 29 with a more-detailed view of the second pad layout.
Figure 35:
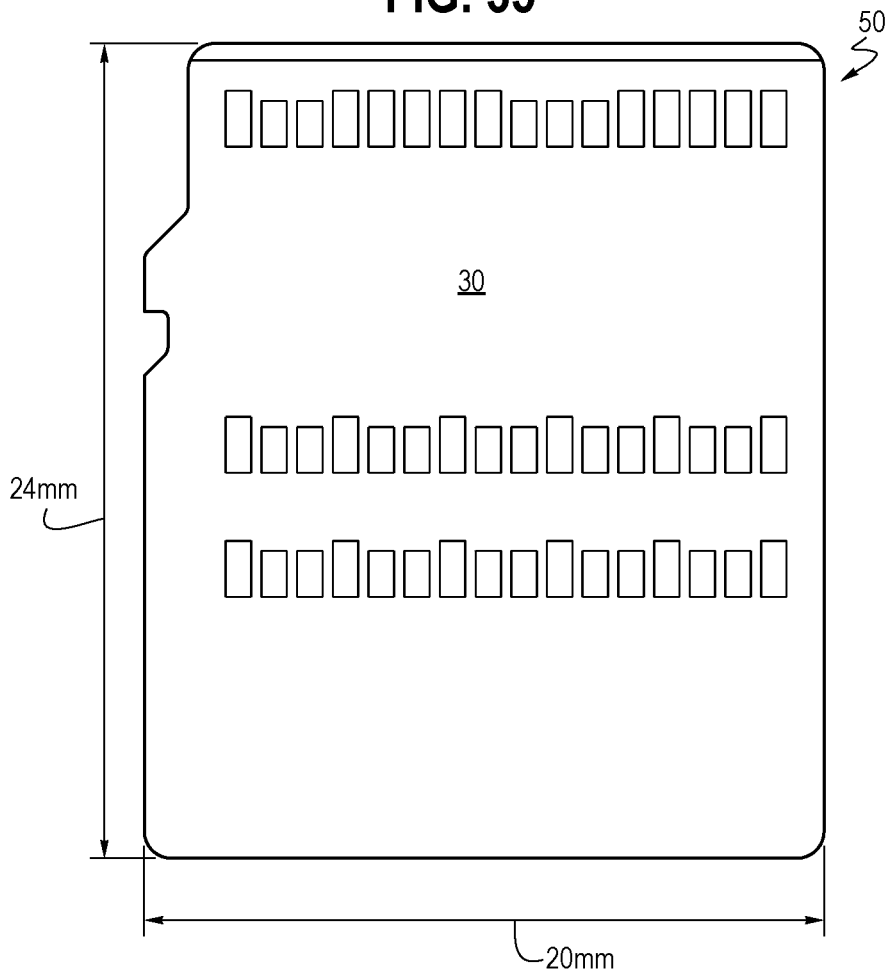
FIG. 35 shows the bottom view of the memory card shown in FIG. 30 with sample dimensions.
Figure 36:
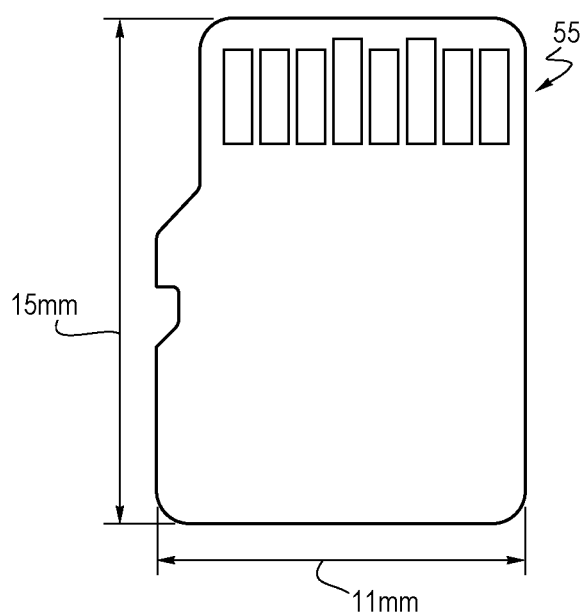
FIG. 36 shows a bottom view of a microSD™ memory card with sample dimensions.

In another embodiment, a memory card with a different form factor is used. FIGS. 18-25 and 28 show various views of one such memory card 50 of an embodiment to illustrate its form factor. FIG. 35 shows sample dimensions of one implementation of the memory card 50, and FIG. 36 shows the dimensions of a standard microSD™ card 55 for comparison. Various pad layouts can be used on the bottom of the memory card. FIGS. 26, 30, and 31 illustrate one example pad layout 30, and FIGS. 27, 29, and 32 illustrate another example pad layout 20.

While the pad layouts 20, 30 provided above have three rows, pad layouts including different number of rows (e.g., to support different number of differential interfaces) can also be used.

While the pad layouts 20, 30 provided above have all side band signals and power pads in separate row from differential signals, some of the pads can be placed in other rows as well.

Figure 33:
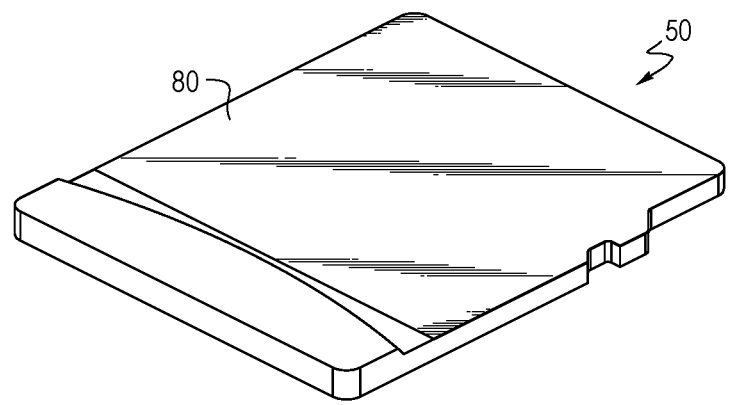
FIG. 33 is a rear, top perspective view of a memory card of another embodiment, in which the memory card has a metal plate.
Figure 34:
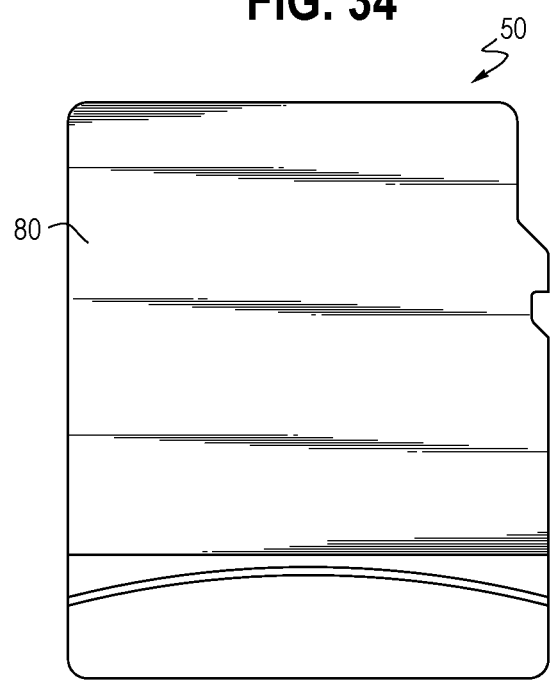
FIG. 34 is a top view of the memory card shown in FIG. 33.
Figure 37:
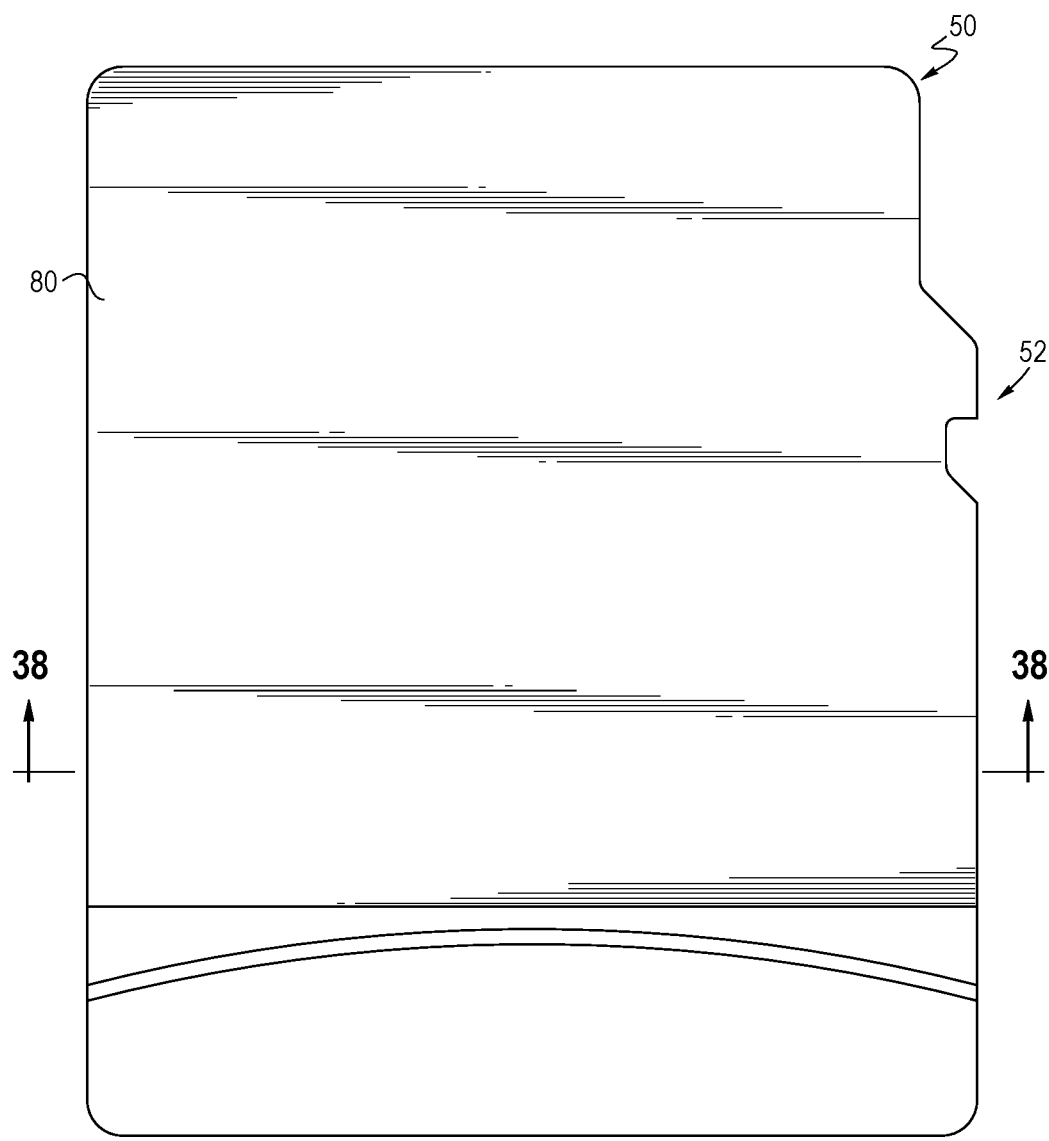
FIG. 37 is a top view of the memory card shown in FIG. 33.
Figure 38:
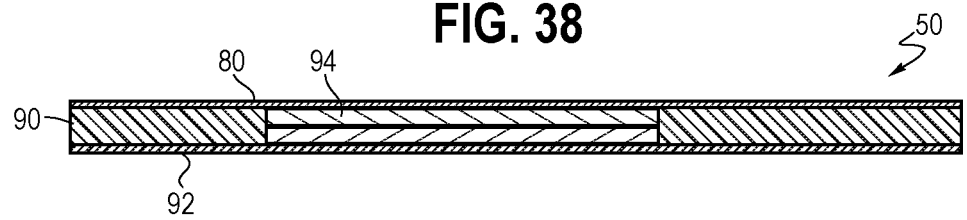
FIG. 38 is a cross-sectional view of the memory card shown in FIG. 37.

To assist with heat dissipation, a metal plate 80 can be used on the top of the memory card 50, and FIGS. 33 and 34 illustrate one example of this. FIGS. 37 and 38 show the metal plate 80 and a cross-sectional view, respectively. This optional metal plate 80 not only provides better thermal conducting, it also provides better protection against electromagnetic interference (EMI) in case the connector is not enough. As shown in the cross-sectional view, the memory card 50 has molded plastic 90, a substrate 92 (upon which the metal plate 80 may stand), and internal components 94.

As can be seen by comparing the form factors of the memory cards 10, 50 of these two embodiments, the card lock mechanism 52 of the memory card 50 of the second embodiment has the shape and size of microSD™ card while the actual card dimension is bigger than microSD™ card.

In general, these embodiments solve the problem of the increased size form factor and the need for a new card lock mechanism. The removable memory card 10, 50 of these embodiments is in a size larger than a typical microSD™ card, which allows higher capacity and better thermal characteristics using higher speeds. A card lock mechanism is desirable to allow better lock of the card in mobile and/or other shaking devices. Regardless of the need for card's shape that allows efficient card lock, the card's area is maximized to allow maximum memory dies as well as large number of pads with enough room for producible supporting connectors.

Also, the asymmetrical front edge of the memory card protect against reverse insertion, the far edge of the memory card allows easy pulling of the card using a finger nail, a partial thin plane is useful in serving low-profile applications, and the partial thicker edge can accommodate internal thicker components Providing a new card lock mechanism or simply increasing the whole microSD™ size in the same proportions (including its locking mechanism) are both possible. If the card is designed by simply increasing dimensions but otherwise using the same ratio of a standard microSD™ card (as in the first embodiment above), the front, narrow part of the card consumes a large part of the card, and there is a quite large non-used area at the front half that limits the memory dies, as well as number of pads in a row or prevents pads with enough room to allow easy connector design. The solution for that would be a further increase of the card's total dimensions. Another method would be to have a wider area in the front but with a new small efficient lock mechanism 55, as shown in the second embodiment. However, usage of the same size and shape of the existing microSD™ locking mechanism while increasing the total size of the card allows utilization of the existing mechanical locking mechanism used in legacy connectors for more than 15 years and can increase confidence and reduce costs. But by keeping the original locking mechanism size while increasing the total card size, the front end of the card is much bigger, which means more card area, more memory, better thermal capabilities, and more area for more pads. It should be noted that, in this embodiment, the ratio of the size between the locking shape and the overall card size is different than microSD™. Only the locking mechanism has the same shape and size.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A memory card comprising:
    a top surface; and
    a bottom surface opposite the top surface, wherein:
        the bottom surface comprises a plurality of pads arranged in a first row, a second row, and a third row;
        the first row of pads is located at a front of the memory card and comprises:
            at least one power supply pad configured to supply power received from a plurality of power contacts of a host to internal circuits in the memory card, wherein the at least one power supply pad comprises all of the power supply pads of the memory card;
            at least one card type detection pad configured to receive a card type detection signal from at least one card type detection contact of the host;
            a card insertion/removal detection pad configured to receive a card insertion/removal detection signal from a card insertion/removal detection contact of the host; and a plurality of sideband signal pads configured to receive sideband signals from a plurality of sideband signal contacts of the host; and the second row and the third row of pads are located rearward of the first row of pads and comprise a plurality of differential signal pads, wherein the plurality of sideband signal pads and the plurality of differential signal pads are aligned on the bottom surface to avoid contacting the at least one card type detection contact, the card insertion/removal detection contact, the plurality of power contacts, and one or more ground pads of the host during insertion and removal of the memory card.

2. The memory card of claim 1, wherein the top surface comprises a metal plate.

3. The memory card of claim 1, further comprising a card locking mechanism.

4. A memory card comprising:

a top surface;

a bottom surface opposite the top surface, wherein:

the bottom surface comprises a plurality of pads arranged in a first row, a second row, and a third row;

the first row of pads is located at a front of the memory card and comprises:

at least one power supply pad configured to supply power received from a plurality of power contacts of a host to internal circuits in the memory card, wherein the at least one power supply pad comprises all of the power supply pads of the memory card;

at least one card type detection pad configured to receive a card type detection signal from at least one card type detection contact of the host;

a card insertion/removal detection pad configured to receive a card insertion/removal detection signal from a card insertion/removal detection contact of the host; and a plurality of sideband signal pads configured to receive sideband signals from a plurality of sideband signal contacts of the host; and the second row and the third row of pads are located rearward of the first row of pads and comprise a plurality of differential signal pads, wherein the plurality of sideband signal pads and the plurality of differential signal pads are aligned on the bottom surface to avoid contacting the at least one card type detection contact, the card insertion/removal detection contact, the plurality of power contacts, and one or more ground pads of the host during insertion and removal of the memory card; and card locking means.

5. A memory card comprising:

a top surface; and a bottom surface opposite the top surface;

wherein:

the bottom surface comprises a plurality of pads arranged in a first row, a second row, and a third row:

the first row of pads is located at a front of the memory card and comprises:

at least one power supply pad configured to supply power received from a plurality of power contacts of a host to internal circuits in the memory card, wherein the at least one power supply pad comprises all of the power supply pads of the memory card;

at least one card type detection pad configured to receive a card type detection signal from at least one card type detection contact of the host;

a card insertion/removal detection pad configured to receive a card insertion/removal detection signal from a card insertion/removal detection contact of the host; and a plurality of sideband signal pads configured to receive sideband signals from a plurality of sideband signal contacts of the host; and the second row and the third row of pads are located rearward of the first row of pads and comprise a plurality of differential signal pads, wherein the plurality of sideband signal pads and the plurality of differential signal pads are aligned on the bottom surface to avoid contacting the at least one card type detection contact, the card insertion/removal detection contact, the plurality of power contacts, and one or more ground pads of the host during insertion and removal of the memory card;

wherein a ratio of a length of the memory card to a width of the memory card is about 15:11.

6. The memory card of claim 5, wherein the top surface comprises a metal plate.

7. The memory card of claim 5, further comprising a card locking mechanism.

* * * * *